(12) United States Patent
Kokubo

(10) Patent No.: US 6,504,784 B1
(45) Date of Patent: Jan. 7, 2003

(54) SEMICONDUCTOR MEMORY DEVICE WITH REDUCED STANDBY CURRENT

(75) Inventor: Nobuyuki Kokubo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/119,093

(22) Filed: Apr. 10, 2002

(30) Foreign Application Priority Data

Jul. 19, 2001 (JP) ........................................ 2001-219989

(51) Int. Cl.$^7$ ................................................. G11C 8/00
(52) U.S. Cl. ................................... 365/229; 365/189.09
(58) Field of Search ............................. 365/229, 189.09

(56) References Cited

U.S. PATENT DOCUMENTS 6,356,484 B2 * 3/2002 Dosaka et al. ......... 365/189.01

FOREIGN PATENT DOCUMENTS

JP          7-45093          2/1995

* cited by examiner

*Primary Examiner*—M. Tran
(74) *Attorney, Agent, or Firm*—McDermott, Will & Emery

(57) ABSTRACT

A load circuit for coupling a bit line pair BLP in a memory cell array to a power supply potential makes a bit line once to a floating state when the mode shifts to a standby mode in accordance with a chip select signal /CS. The load circuit holds the potential of the bit line BL in a latch circuit and determines whether the bit line BL is coupled to the power supply potential or not in accordance with the held potential. Therefore, in the case where a small short circuit occurs between the bit line and the ground line, the bit line is disconnected from the power supply potential, thereby enabling the current in the standby mode to be reduced.

17 Claims, 17 Drawing Sheets

FIG.13

|  | /WE |
|---|---|
| STANDBY MODE | H |
| READING MODE | H |
| WRITING MODE | L |

FIG.14

| OCCURRENCE OF SHORT-CIRCUIT | MODE | /WE | BL | φ1delay | φ2 | N21 | N22 | 530 |
|---|---|---|---|---|---|---|---|---|
| NO | STANDBY | H | H | H | H | H | L | ON |
| NO | READING | H | H | H | H | H | L | ON |
| NO | WRITING | L | H | H | H | H | L | ON |
| YES | STANDBY | H | L | H | H | L | H | OFF |
| YES | READING | H | L | H | H | L | H | OFF |
| YES | WRITING | L | L | H | H | L | H | OFF |

FIG.15

| OCCURRENCE OF SHORT-CIRCUIT | MODE | /WE | BL | φ1delay | φ2 | N21 | N22 | 530 |
|---|---|---|---|---|---|---|---|---|
| NO | STANDBY | H | H | L | L | H | L | ON |
| NO | READING | H | H | L | L | H | L | ON |
| NO | WRITING | L | H | L | L | H | L | ON |
| NO | WRITING | L | L | L | L | H | L | ON |
| YES | STANDBY | H | L | L | H | L | H | OFF |
| YES | READING | H | L | L | H | L | H | OFF |
| YES | WRITING | L | L | L | L | L | H | OFF |

SEMICONDUCTOR MEMORY DEVICE WITH REDUCED STANDBY CURRENT

BACKGROUND OF THE INVENTION

1. Field of the Invention

The present invention relates to a semiconductor memory device and, more particularly, to a static random access memory (SRAM with a reduced standby current.

2. Description of the Background Art

FIG. 16 is a circuit diagram showing the configuration of a memory cell array 800 of a conventional SRAM.

Referring to FIG. 16, conventional memory cell array 800 includes a plurality of word lines WL1, WL2, . . . and a plurality of bit lines BL1, /BL1, BL2, /BL2, . . .

Bit lines BL1 and /BL1 form a bit line pair BLP1. Bit lines BL2 and /BL2 form a bit line pair BLP2.

Memory cell array 800 further includes: a load circuit 802 connected to bit line pair BLP1 and a plurality of memory cells 804 provided at intersecting points of bit line pair BLP1 and word lines WL1, WL2, . . . Similarly, memory cell array 800 includes load circuit 802 and plurality of memory cells 804 provided at intersecting points of bit line pair BLP2 and word lines.

Load circuit 802 includes a P-channel MOS transistor 806 connected between bit line BL1 and a power supply node and having a gate coupled to the ground potential, and a P-channel MOS transistor 808 connected between complementary bit line /BL1 and the power supply node and having a gate coupled to the ground potential.

Load circuit 802 is provided to read data from a memory cell at high speed. Specifically, the bit lines are precharged to the power supply potential by P-channel MOS transistors 806 and 808 of high resistance which are always conductive. When a word line is activated, by a driver transistor of the memory cells, one of the bit lines in the pair is pulled down. A sense amplifier connected to the bit line pair detects a slight potential difference which occurs between the bit lines of the pair and reads data at high speed.

Consequently, even when the driving force of the driver transistor of the memory cells is not so strong, data held in a memory cell can be read at high speed via the bit lines.

Memory cell 804 includes: an N-channel MOS transistor 810 connected between the bit line and a node N55 and having a gate connected to the word line; a P-channel MOS transistor 816 connected between the power supply node and a node N56 and having a gate connected to node N55; an N-channel MOS transistor 818 connected between a node N56 and the ground node and having a gate connected to node N55; an N-channel MOS transistor 820 connected between node N56 and the complementary bit line and having a gate connected to the word line; a P-channel MOS transistor 812 connected between the power supply node and node N55 and having gate connected to node N56; and an N-channel MOS transistor 814 connected between node N55 and the ground node and having a gate connected to node N56.

Memory cell array 800 includes a first ground line LG1 disposed adjacent to and parallel to bit line BL1 and a second ground line LG2 disposed adjacent to and parallel to bit line BL2.

In a manufacturing process, due to dusts or the like, there is a case that a short circuit occurs between bit line BL1 and ground line LG1 as shown by an arrow in FIG. 16. When such a failure occurs, data cannot be transmitted/received to/from the memory cell column connected to bit line BL1.

FIG. 17 is a diagram for explaining the failure occurred in the memory array.

Referring to FIG. 17, a case where a short circuit is caused by a foreign matter 836 between a ground line LG1 and a bit line BL1 is shown. Bit line BL1 in FIG. 17 corresponds to bit line BL1 in FIG. 16, and ground line BL1 in FIG. 17 corresponds to ground line LG1 adjacent to bit line BL1 in FIG. 16. In such a case, the memory cell column connected to bit line BL1 becomes defective and is repaired by a redundancy circuit provided in the memory cell.

However, when the defective portion is left, an unnecessary current flows from the power supply node to ground line LG1 via load circuit 802 and the bit line. In such a case, a problem arises such that a current in a standby mode in which writing and reading operations can be normally performed, that is, a standby current increases.

FIG. 18 is a circuit diagram showing a path of the current passed due to a failure which occurs in another position.

Referring to FIG. 18, a case where a short circuit occurs between the power supply node and the ground node in a memory cell is shown. Even in the case where such a short circuit occurs, after the failure is repaired by the redundancy circuit, the reading and writing operations can be normally performed. However, a problem such that a current in the standby mode increases occurs likewise.

An SRAM is often used in a portable telephone and a portable information device which are actively commercialized in recent years since control on the SRAM is easier than that on a dynamic random access memory or the like. Since each of the portable devices is driven on a battery, the current consumption in the standby mode is requested to be as little as possible. Consequently, when a current increases in the standby mode due to some factor, even if the other operations are normal, the device is a defective. It causes deterioration in yield.

Conventionally, repairing operation using a redundancy circuit is conducted to repair a failure which increases the standby current.

FIG. 19 is a circuit diagram showing the configuration of a memory cell array of a conventional SRAM disclosed in Japanese Patent Laying-Open No. 7-45093.

Referring to FIG. 19, the memory cell is provided with a power supply line 901 through which the power supply potential is supplied, a ground line 902 through which a ground potential for memory cells is supplied, and a power supply line 910 through which a power supply potential for memory cells is supplied.

To the memory cell array, a precharge signal for controlling the gates of bit line load transistors 923, 924, 933, and 934 is supplied via a signal line 903. Via a signal line 904, an equalize signal for controlling the gate of an N-channel transistor 912 which short-circuits a pair of normal bit lines 906a and 906b connected to normal memory cells and short-circuits a pair of spare bit lines 907a and 907b connected to spare memory cells is supplied.

When a word line 905 is made active, memory cells 911 are selected.

In the case where an error bit occurs in the normal memory cell array, the normal memory cell column in which the error bit exists is not selected but a first spare memory cell column is selected with respect to the same address, thereby enabling an operation error of the semiconductor memory device to be prevented.

A bit line load circuit 917 of the pair of normal bit lines 906a and 906b includes: a first load circuit having N-channel MOS transistors 921 and 922 whose gates are connected to the ground potential; and a second load circuit having N-channel MOS transistors 923 and 924 having gates to which a precharge signal is supplied via signal line 903.

A control signal generating circuit 940 is provided to control a bit line load circuit 918 of a pair of spare bit lines 907a and 907b.

Control signal generating circuit 940 receives a precharge signal via signal line 903 and receives a spare bit line pair control signal indicative of whether the spare memory cell column is used or not via a signal line 906. The spare bit line pair control signal is set to the L level when the spare memory cell column is used, and is set to the H level when the spare memory cell column is not used.

In the case where a short circuit occurs due to a particle existing between the spare memory cell column and a ground potential line, the first spare memory cell column can not be used as a spare memory cell column. In this case, a spare bit line pair control signal is fixed at the H level, so that a signal line 942 becomes the L level. In bit line load circuit 918 of the pair of spare bit lines 907a and 907b, N-channel MOS transistors 931 and 932 are made non-conductive.

Although the conventional SRAM shown in FIG. 19 is effective in preventing an increase in the standby current caused by a failure occurred in a spare bit line, it has a problem such that an increase in the standby current due to a failure occurred in another portion in the memory array cannot be prevented.

Moreover, a control signal for interrupting a current path has to be supplied to an unused spare bit line by a setting from the outside. In the case of a memory cell column which does not operate normally and an unused memory cell column, it is possible to supply a control signal from the outside to interrupt a current path. However, in the case such that a short circuit occurs with high resistance between the bit line and the ground line, since the reading and writing operation is performed normally, such a control signal cannot be supplied. It consequently causes a problem such that a failure occurring out of the standby current specification cannot be repaired.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a diagram showing the logic state of a write enable signal /WE;

FIG. 14 is a diagram showing the state of each of nodes in the case where an initial potential is applied to a bit line after a power is turned on and the bit line is in a floating state, that is, when a signal φ1delay is at the H level;

FIG. 15 is a diagram showing an operating state of a load circuit 520 when signal φ1delay goes low after elapse of some time since the turn-on of the power;

SUMMARY OF THE INVENTION

An object of the invention is to provide a semiconductor memory device with a reduced standby current.

In short, the invention is directed to a semiconductor memory device having a normal mode and a standby mode as operation modes and having a memory cell array including a plurality of memory cells arranged in a matrix.

The memory cell array includes: a plurality of bit lines provided in correspondence with columns of memory cells; and a load circuit for coupling the plurality of bit lines to a predetermined bias potential, after that, making the plurality of bit lines enter a floating state where the plurality of bit lines are disconnected from the predetermined bias potential, and in a standby mode, coupling the bias potential to each of the plurality of bit lines in accordance with the potential of each of the plurality of bit lines in the floating state.

According to another aspect of the invention, there is provided a semiconductor memory device having a normal mode and a standby mode as operation modes, and having a memory cell array including a plurality of memory cells arranged in a matrix.

The memory cell array includes: a power supply line for supplying a power supply potential to a part of the plurality of memory cells; and a potential supplying circuit for coupling the power supply line to the power supply potential, after that, making the power supply line enter a floating state where the power supply line is disconnected from the power supply potential, and coupling the power supply line to the power supply potential in accordance with the potential of the power supply line in the floating state in a standby mode.

Therefore, a main advantage of the invention is that the current in the standby mode can be reduced in the case where a short circuit occurs in a bit line.

DESCRIPTION OF THE PREFERRED EMBODIMENTS

Embodiments of the invention will be described in detail with reference to the drawings.

First Embodiment

Figure 1:
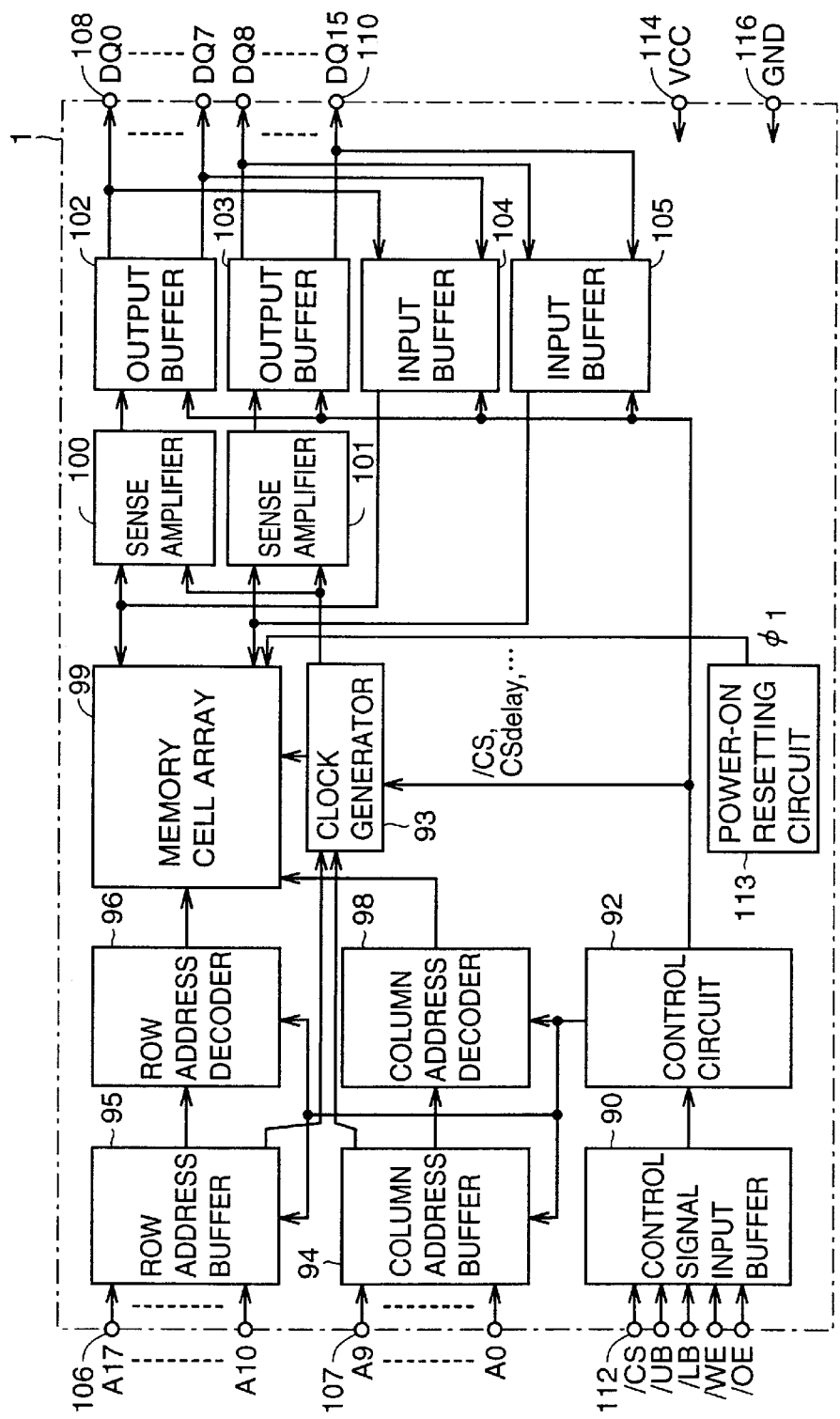
FIG. 1 is a block diagram showing the configuration of a semiconductor memory device 1 of a first embodiment of the invention.

FIG. 1 is a block diagram showing the configuration of a semiconductor memory device 1 of a first embodiment of the invention.

Referring to FIG. 1, a semiconductor memory device 1 includes: an input terminal group 112 for receiving control signals /CS, /OE, /WE, /LB, and /UB; a terminal group 108 to/from which data signals DQ0 to DQ7 are input/output; a terminal group 110 to/from which data signals DQ8 to DQ15 are input/output; a terminal group 107 to which address signals A0 to A9 are input; a terminal group 106 to which address signals A11 to A17 are input; a power supply terminal 114 to which a power supply potential VCC is applied; and a ground terminal 116 to which ground voltage GND is applied.

Control signal /CS is a chip select signal for selecting a chip when semiconductor memory device 1 is accessed from the outside. Control signal /OE is an output enable signal for setting semiconductor memory device 1 into a reading mode and activating an output buffer. Control signal /WE is a write enable signal for setting semiconductor memory device 1 into a writing mode. Control signal /LB is a signal for selecting that data is input/output from/to data terminal group 108 on the low-order side. Control signal /UB is a signal for selecting that data is input/output from/to data terminal group 110 on the high-order side.

Semiconductor memory device 1 further includes: a control signal input buffer 90 for amplifying a signal supplied from input terminal group 112 and transmitting the amplified signal to the inside; and a control circuit 92 for outputting control clocks corresponding to a predetermined operation mode (reading mode, writing mode, or the like) of semiconductor memory device 1 to blocks in accordance with an output of control signal input buffer 90. The control clocks include signals /CS and CSdelay internally used which will be described hereinafter. Signal CSdelay is as an inversion signal of a signal obtained by delaying only the falling edge of signal /CS by predetermined time.

Semiconductor memory device 1 further includes: a column address buffer 94 for receiving address signals A0 to A9 and transmitting the signals to the inside in accordance with an output of control circuit 92; and a row address buffer 95 for receiving address signals A10 to A17 and transmitting the signals to the inside in accordance with an output of control circuit 92.

Semiconductor memory device 1 further includes: a row address decoder 96 for receiving an internal address signal output from row address buffer 95 in accordance with an output of control circuit 92 and selecting a word line WL; a column address decoder 98 for receiving an internal address signal output from column address buffer 94 in accordance with an output of control circuit 92 and selecting a bit line; a clock generator 93 for monitoring outputs of row address buffer 95 and column address buffer 94, detecting a change in an address, and generating a control clock signal in accordance with an output of control circuit 92; and a memory cell array 99 including memory cells arranged in a matrix.

Semiconductor memory device 1 further includes: sense amplifiers 100 and 101 for amplifying an output from memory cell array 99 and outputting an amplified output; and output buffers 102 and 103 for receiving outputs of sensor amplifiers 100 and 101, respectively, and outputting data signals to terminal groups 108 and 110, respectively.

Semiconductor memory device 1 further includes input buffers 104 and 105 for receiving data signals DQ0 to DQ7 and DQ8 to DQ15 from terminal groups 108 and 110, respectively, in accordance with an output of control circuit 92, and writing the data signals to memory cell array 99.

Semiconductor memory device 1 further includes a power-on reset circuit 113 for outputting a power-on reset signal φ1 to memory cell array 99 at the rising edge of power supply potential VCC.

Figure 2:
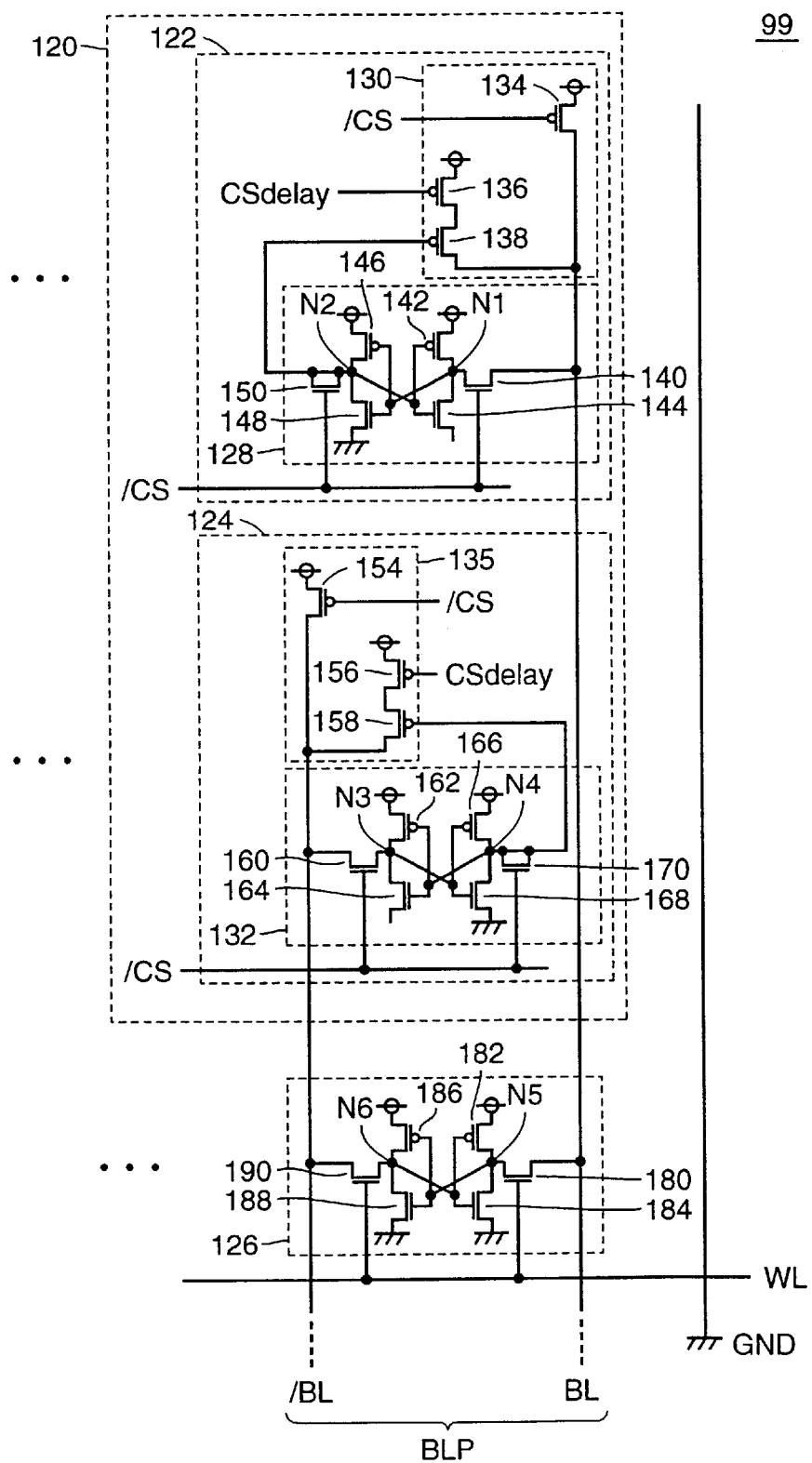
FIG. 2 is a circuit diagram showing the configuration of a memory cell array 99 in FIG. 1.

FIG. 2 is a circuit diagram showing the configuration of memory cell array 99 in FIG. 1.

Referring to FIG. 2, memory cell array 99 includes: a load circuit 120 connected to a bit line pair BLP constructed by bit lines BL and /BL, and a plurality of memory cells 126 provided at intersecting points of word line WL and bit line pair BLP. In FIG. 2, load circuit 120 of one bit line pair and one memory cell are representatively shown.

Memory cell 126 includes: an N-channel MOS transistor 180 connected between bit line BL and a node N5 and having a gate connected to word line WL; a P-channel MOS transistor 186 connected between the power supply node and a node N6 and having a gate connected to node N5; and an N-channel MOS transistor 188 connected between node N6 and the ground node and having a gate connected to node N5.

Memory cell 126 further includes an N-channel MOS transistor 190 connected between bit line /BL and node N6 and having a gate connected to word line WL; a P-channel MOS transistor 182 connected between the power supply node and node N5 and having a gate connected to node N6; and an N-channel MOS transistor 184 connected between node N5 and the ground node and having a gate connected to node N6.

Load circuit 120 includes a load circuit 122 connected to bit line BL and a load circuit 124 connected to bit line /BL.

Load circuit 122 includes a latch circuit 128 for latching the potential of bit line BL; and a coupling circuit 130 for coupling bit line BL to the power supply potential in accordance with an output of latch circuit 128, chip select signal /CS, and signal CSdelay.

Latch circuit 128 includes: an N-channel MOS transistor 140 connected between bit line BL and a node N1 and having a gate for receiving chip select signal /CS; a P-channel MOS transistor 146 connected between the power supply node and a node N2 and having a gate connected to node N1; and an N-channel MOS transistor 148 connected between node N2 and the ground node and having a gate connected to node N1.

Latch circuit 128 further includes: an N-channel MOS transistor 150 having a source and a drain connected to node N2 and a gate for receiving chip select signal /CS; a P-channel MOS transistor 142 connected between the power supply node and node N1 and having a gate connected to node N2; and an N-channel MOS transistor 144 having a gate connected to node N2, of which one end is connected to node N1 and of which other end is open.

Coupling circuit 130 includes: a P-channel MOS transistor 134 connected between the power supply node and bit line BL and having a gate for receiving chip select signal /CS; and P-channel MOS transistors 136 and 138 connected in series between the power supply node and bit line BL. The gate of P-channel MOS transistor 136 receives signal CSdelay. The gate of P-channel MOS transistor 138 is connected to node N2.

Load circuit 124 includes: a latch circuit 132 for latching the potential of bit line /BL; and a coupling circuit 135 for coupling the power supply node and bit line /BL in accordance with an output of latch circuit 132, chip select signal ICS, and signal CSdelay.

Latch circuit 132 includes: an N-channel MOS transistor 160 connected between bit line /BL and a node N3 and having a gate for receiving chip select signal /CS; a P-channel MOS transistor 166 connected between the power supply node and a node N4 and having a gate connected to node N3; and an N-channel MOS transistor 168 connected between node N4 and the ground node and having a gate connected to node N3.

Latch circuit 132 further includes: an N-channel MOS transistor 170 having a source and a drain connected to node N4 and having a gate for receiving chip select signal /CS; a P-channel MOS transistor 162 connected between the power supply node and node N3 and having a gate connected to node N4; and an N-channel MOS transistor 164 having a gate connected to node N4, of which one end is connected to node N3, and of which other end is open.

Coupling circuit 135 includes: a P-channel MOS transistor 154 connected between the power supply node and bit line /BL and having a gate for receiving chip select signal /CS; and P-channel MOS transistors 156 and 158 connected in series between the power supply node and bit line /BL.

The gate of P-channel MOS transistor 156 receives signal CSdelay. The gate of P-channel MOS transistor 158 is connected to node N4.

Figure 3:
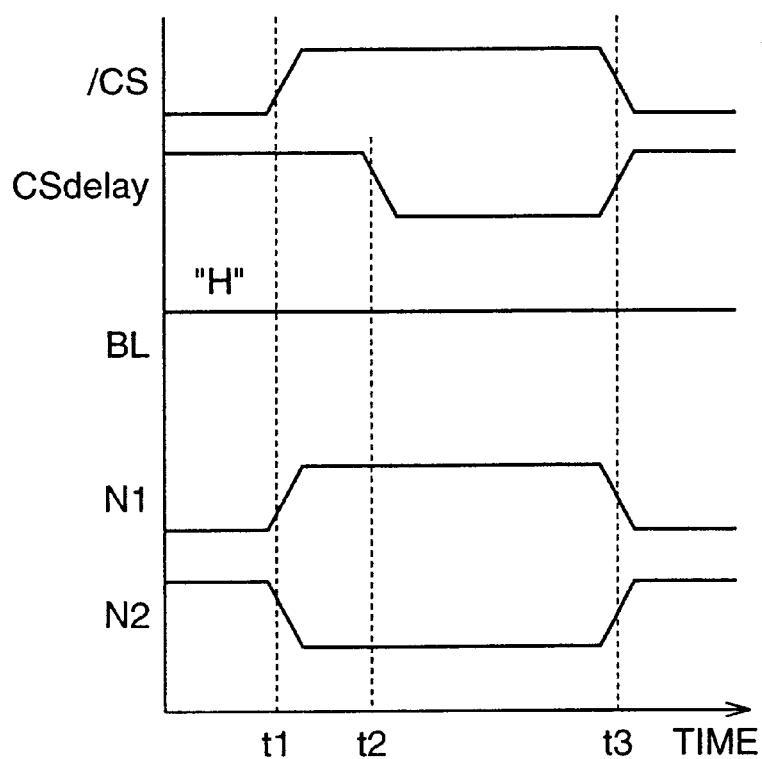
FIG. 3 is an operational waveform chart for explaining the operation of a load circuit 120 in FIG. 2 in the case where no short circuit occurs in a bit line.

FIG. 3 is an operational waveform chart for explaining the operation of load circuit 120 in FIG. 2 in the case where no short circuit occurs in the bit lines.

Referring to FIGS. 2 and 3, chip select signal /CS is active low. When chip select signal /CS is at the H level, it indicates a standby mode. Before time t1, chip select signal /CS is at the L level and is active, P-channel MOS transistor 134 is conductive, and signal CSdelay is at the H level. Consequently, a current path formed by P-channel MOS transistors 136 and 138 is interrupted. Since N-channel MOS transistor 140 as the input gate of latch circuit 128 is non-conductive, there is no problem with a normal memory cell operation.

At time t1, when chip select signal /CS is changed from the L level to the H level to set the standby mode, since the potential of bit line BL has been coupled to the power supply potential by P-channel MOS transistor 134 until the last moment, the potential at node N1 goes high, and the potential at node N2 goes low.

At time t2, when signal CSdelay as an inversion signal of the signal obtained by delaying the rising edge of chip select signal /CS changes from the H level to the L level, P-channel MOS transistors 136 and 138 become conductive, so that the potential on bit line BL is held at the H level. Signal CSdelay is generated from, for example, chip select signal /CS by control circuit 92. Alternately, a circuit for delaying the rising edge of chip select signal /CS, inverting the resultant, and outputting the inverted signal may be provided near the memory array.

In such a manner, the potential on the bit line BL is held at the H level for the standby period from time t2 to time t3.

Figure 4:
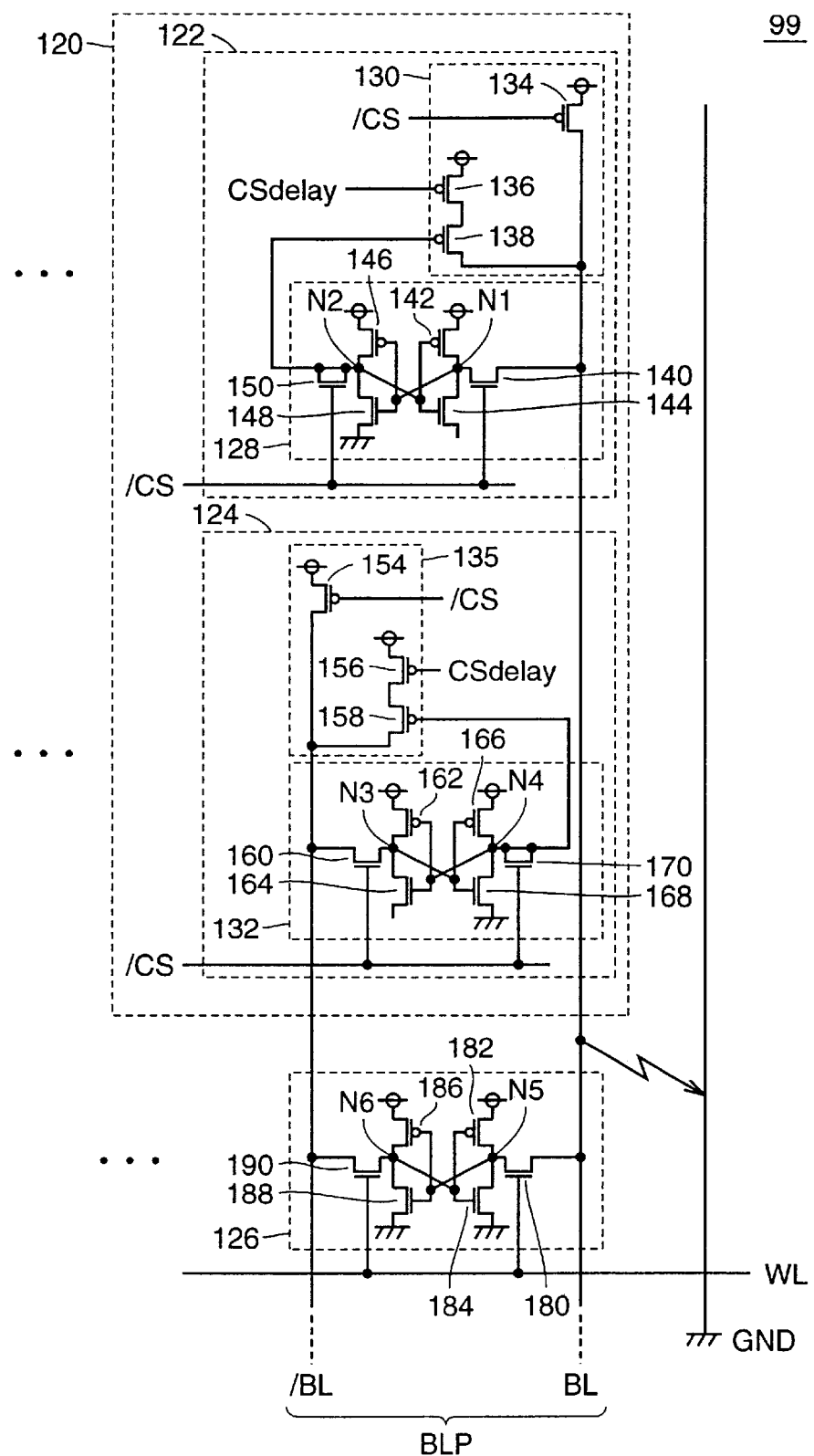
FIG. 4 is a diagram showing a state where a short circuit occurs between a bit line BL and a ground line.

FIG. 4 is a diagram showing a state where a short circuit occurs between bit line BL and the ground line.

FIG. 4 shows a case where a short circuit occurs between bit line BL and the ground line adjacent to bit line BL by a foreign matter, etching failure, or the like and it causes a standby current failure which cannot be prevented by the conventional technique.

Figure 5:
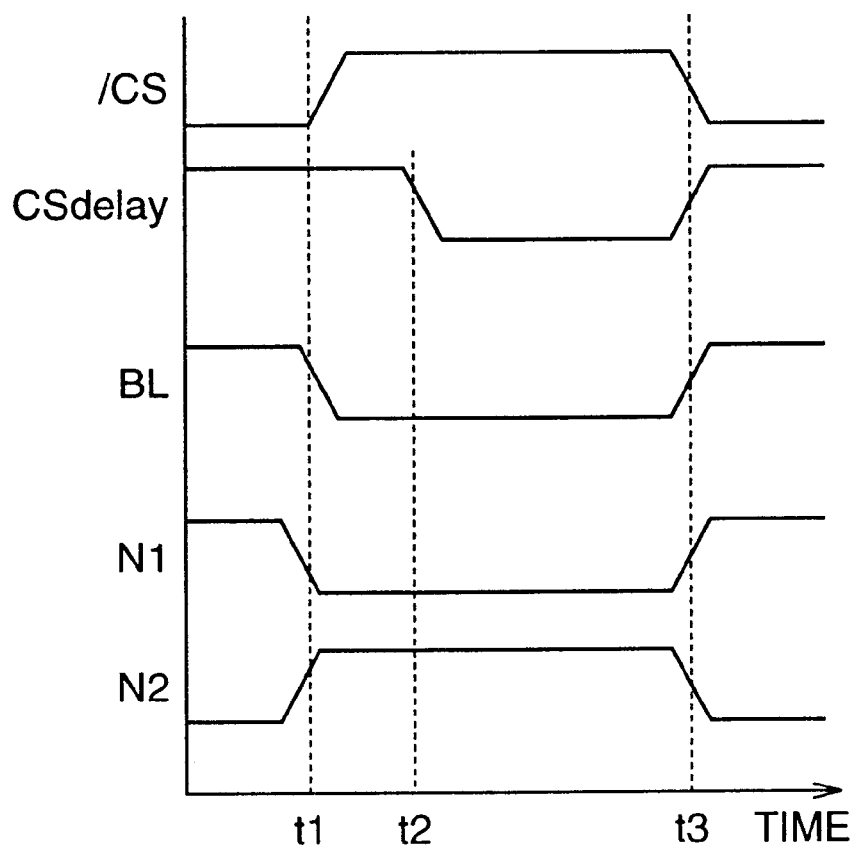
FIG. 5 is an operational waveform chart for explaining the operation of the load circuit 120 in the case where a short circuit shown in FIG. 4 occurs.

FIG. 5 is an operational waveform chart for explaining the operation of load circuit 120 in the case where the short circuit shown in FIG. 4 occurs.

Referring to FIGS. 4 and 5, before time t1, P-channel MOS transistor 134 is conductive, so that the potential on bit line BL is set at the H level.

At time t1, chip select signal /CS is set from the L level to the H level to set the SRAM into the standby mode, and P-channel MOS transistor 134 is made non-conductive. The bit line inherently enters a floating state that it is connected to nowhere. However, due to the short circuit occurred between the bit line and the ground line, the potential on bit line BL changes from the H level to the L level. The value of the L level is captured by latch circuit 128, the potential at node N1 goes low, and the potential at node N2 goes high.

At time t2, signal CSdelay goes low from the H level, so that P-channel MOS transistor 136 is made conductive. However, since the potential at node N2 is at the H level, P-channel MOS transistor 138 remains non-conductive. Consequently, coupling circuit 130 does not connect bit line BL to the power supply node, so that bit line BL remains at the L level, and the current does not continuously flow in the path where the short circuit occurs. Therefore, the standby current in the period from time t2 to time t3 is reduced as compared with the conventional circuit. Even in the case where the standby current failure occurs in the conventional technique, by applying the invention, the standby current can be set to a normal value, and the yield of the chip can be improved.

Referring again to FIG. 2, each of latch circuits 128 and 132 included in load circuit 120 of the invention has the circuit configuration very similar to that of memory cell 126. By modifying memory cell 126, the latch circuit can be formed. With such a configuration, the invention can be realized by increasing only the area of one or two rows of memory cells in the memory cell array, which are disposed at the minimum pitch with high packing density. Therefore, the standby current can be reduced without largely increasing the area.

Figure 6:
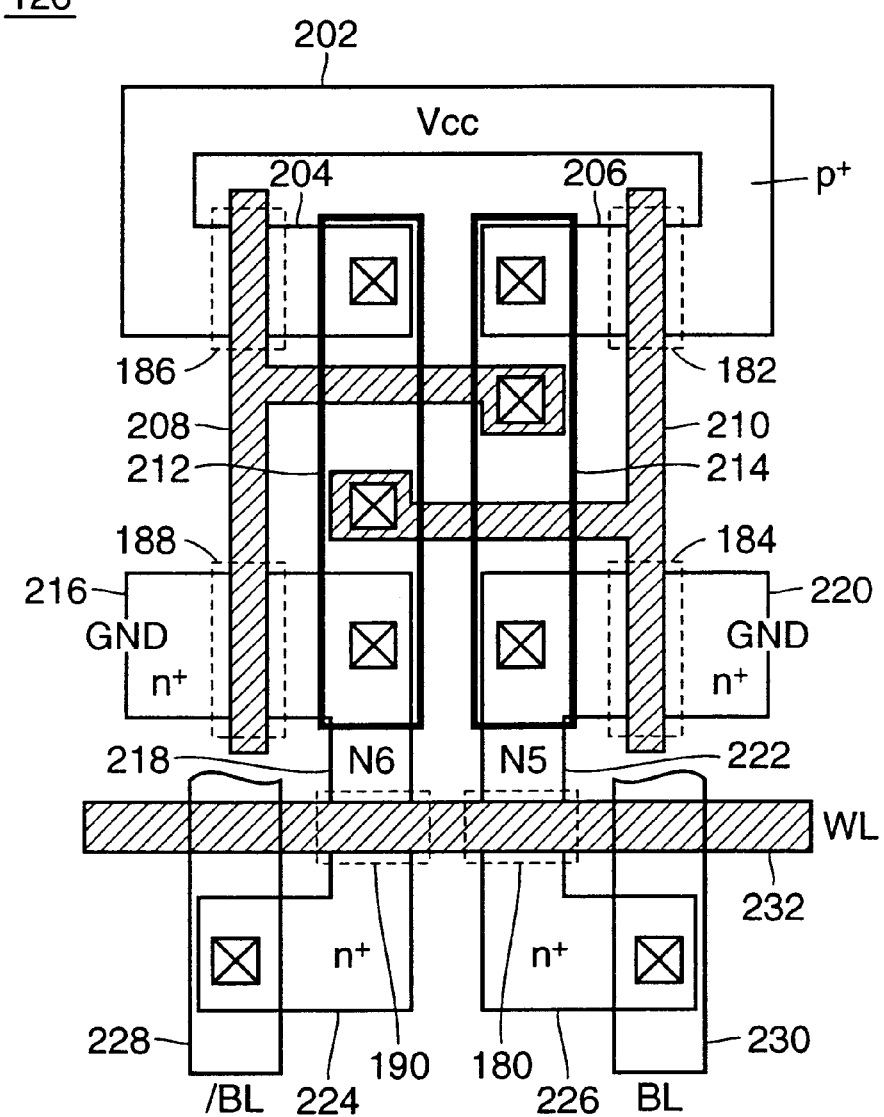
FIG. 6 is a plan view showing layout of elements of a memory cell 126 in FIG. 2.

FIG. 6 is a plan view showing the layout of elements of memory cell 126 in FIG. 2.

Referring to FIG. 6, memory cell 126 includes p+ impurity regions 204 and 206, n+ impurity regions 218, 222, 224, and 226, a p+ impurity region 202 connected to the power supply potential, and n+ impurity regions 216 and 220 connected to the ground potential.

Memory cell 126 further includes conductive layers 208, 210, and 232 made of polysilicon and metal wiring layers 212, 214, 228, and 230.

By conductive layer 208 and p+ impurity regions 202 and 204, P-channel MOS transistor 186 is constructed. By p+ impurity regions 206 and 202 and conductive layer 210, P-channel MOS transistor 182 is constructed. By n+ impurity regions 216 and 218 and conductive layer 208, N-channel MOS transistor 188 is constructed. By n+ impurity regions 220 and 222 and conductive layer 210, N-channel MOS transistor 184 is constructed. By n+ impurity regions 218 and 224 and conductive layer 232, N-channel MOS transistor 190 is constructed. By n+ impurity regions 222 and 226 and conductive layer 232, N-channel MOS transistor 180 is constructed.

Metal wiring layer 212 is connected to p+ impurity region 204, conductive layer 210, and n+ impurity region 218 via contact holes and corresponds to node N6 in FIG. 2. Metal wiring layer 214 is connected to p+ impurity region 206, conductive layer 208, and n+ impurity region 222 via contact holes and corresponds to node N5 in FIG. 2. Metal wiring layer 228 is connected to n+ impurity region 224 via a contact hole and corresponds to bit line /BL in FIG. 2. Metal wiring layer 230 is connected to n+ impurity region 226 via a contact hole and corresponds to bit line BL in FIG. 2. Conductive layer 232 corresponds to word line WL in FIG. 2.

Figure 7:
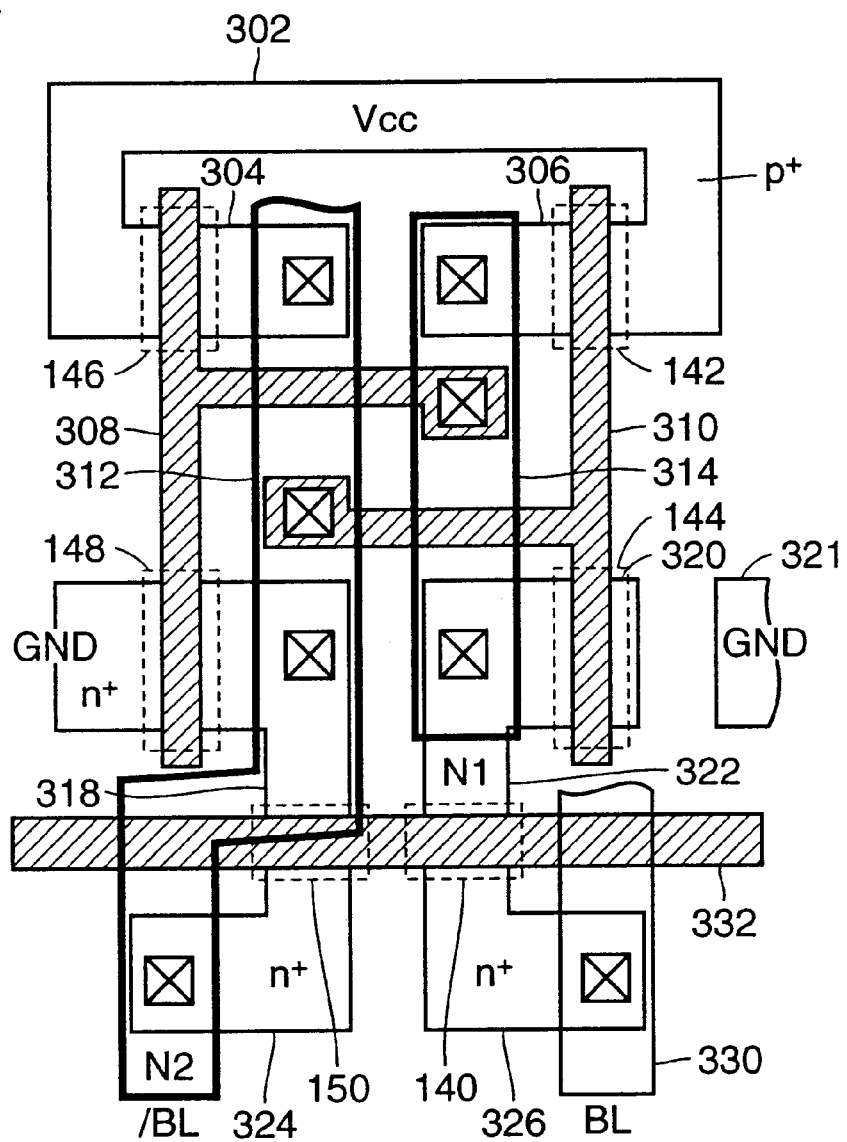
FIG. 7 is a diagram showing layout of elements of a latch circuit 128 in FIG. 2.

FIG. 7 is a diagram showing the layout of elements of latch circuit 128 in FIG. 2.

Referring to FIG. 7, latch circuit 128 includes p+ impurity regions 304 and 306, n+ impurity regions 318, 322, 324, and 326, a p+ impurity region 302 connected to the power supply potential, and n+ impurity regions 316 and 320 connected to the ground potential.

Latch circuit 128 further includes conductive layers 308, 310, and 332 made of polysilicon and metal wiring layers 312, 314, 328, and 330.

By conductive layer 308 and p+ impurity regions 302 and 304, P-channel MOS transistor 146 is constructed. By p+ impurity regions 306 and 302 and conductive layer 310, P-channel MOS transistor 142 is constructed. By n+ impurity regions 316 and 318 and conductive layer 308, N-channel MOS transistor 148 is constructed. By n+ impurity regions 320 and 322 and conductive layer 310, N-channel MOS transistor 144 is constructed. By n+ impurity regions 318 and 324 and conductive layer 332, N-channel MOS transistor 150 is constructed. By n+ impurity regions 322 and 326 and conductive layer 332, N-channel MOS transistor 140 is constructed.

Metal wiring layer 312 is connected to p+ impurity region 304, conductive layer 310, and n+ impurity regions 318 and 324 via contact holes and corresponds to node N2 in FIG. 2. Metal wiring layer 314 is connected to p+ impurity region 306, conductive layer 308, and n+ impurity region 322 via contact holes and corresponds to node N1 in FIG. 2. Metal wiring layer 330 is connected to n+ impurity region 326 via a contact hole and corresponds to bit line BL in FIG. 2. Conductive layer 332 corresponds to a signal line in FIG. 2 through which chip select signal /CS is supplied.

From comparison between FIGS. 6 and 7, it is understood that memory cell 126 can be changed to latch circuit 128 of FIG. 7 by connecting metal wiring layers 212 and 228 in FIG. 6 and disconnecting the source portion of transistor 184 from the ground node. In FIG. 7, it is also possible to eliminate transistors 144 and 150 by not forming impurity regions 320 and 324.

In such a manner, by using the latch circuit having the same size as that of the memory cell, the latch circuit can be disposed at a pitch similar to that of memory cells with high density. Thus, an increase in the area of the memory cell array can be minimized.

As described above, in the semiconductor memory device of the first embodiment, first, the current in the standby mode can be reduced in the case where a short circuit which is small enough not to cause an operation failure occurs.

Second, in a memory cell column in which a short circuit occurs in a bit line and which is replaced by a redundancy column, the power supply current in the standby mode can be reduced.

Second Embodiment

Figure 8:
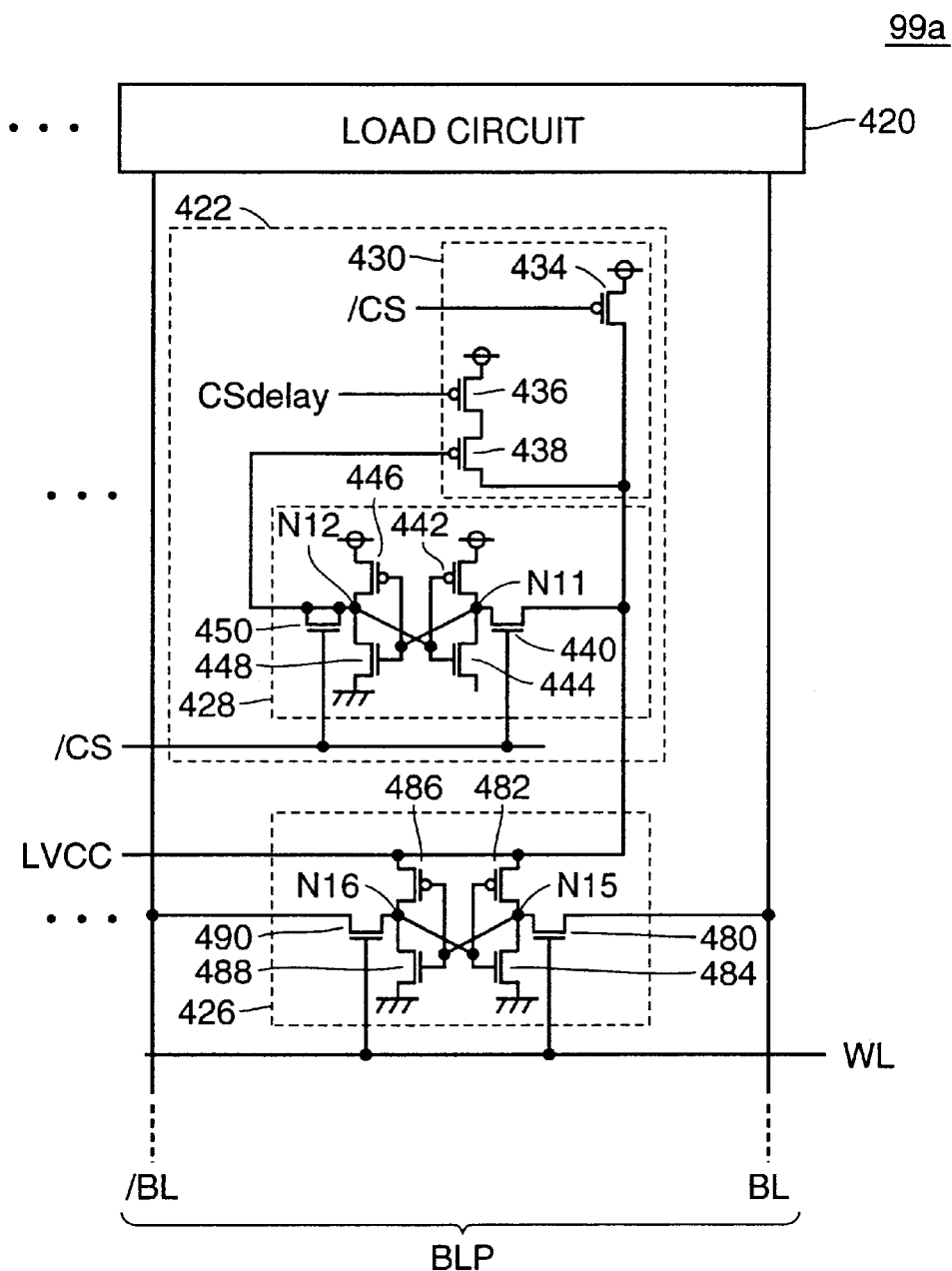
FIG. 8 is a circuit diagram showing the configuration of a memory cell array in a second embodiment.

FIG. 8 is a circuit diagram showing the configuration of a memory cell array in a second embodiment.

Referring to FIG. 8, a memory cell array 99a includes: a load circuit 420 connected to bit lines BL and /BL, memory cells 426 provided at intersecting points of word line WL and bit line pair BLP, and a potential supplying circuit 422 for applying a power supply potential to a power supply line LVCC of memory cells 426.

Figure 16:
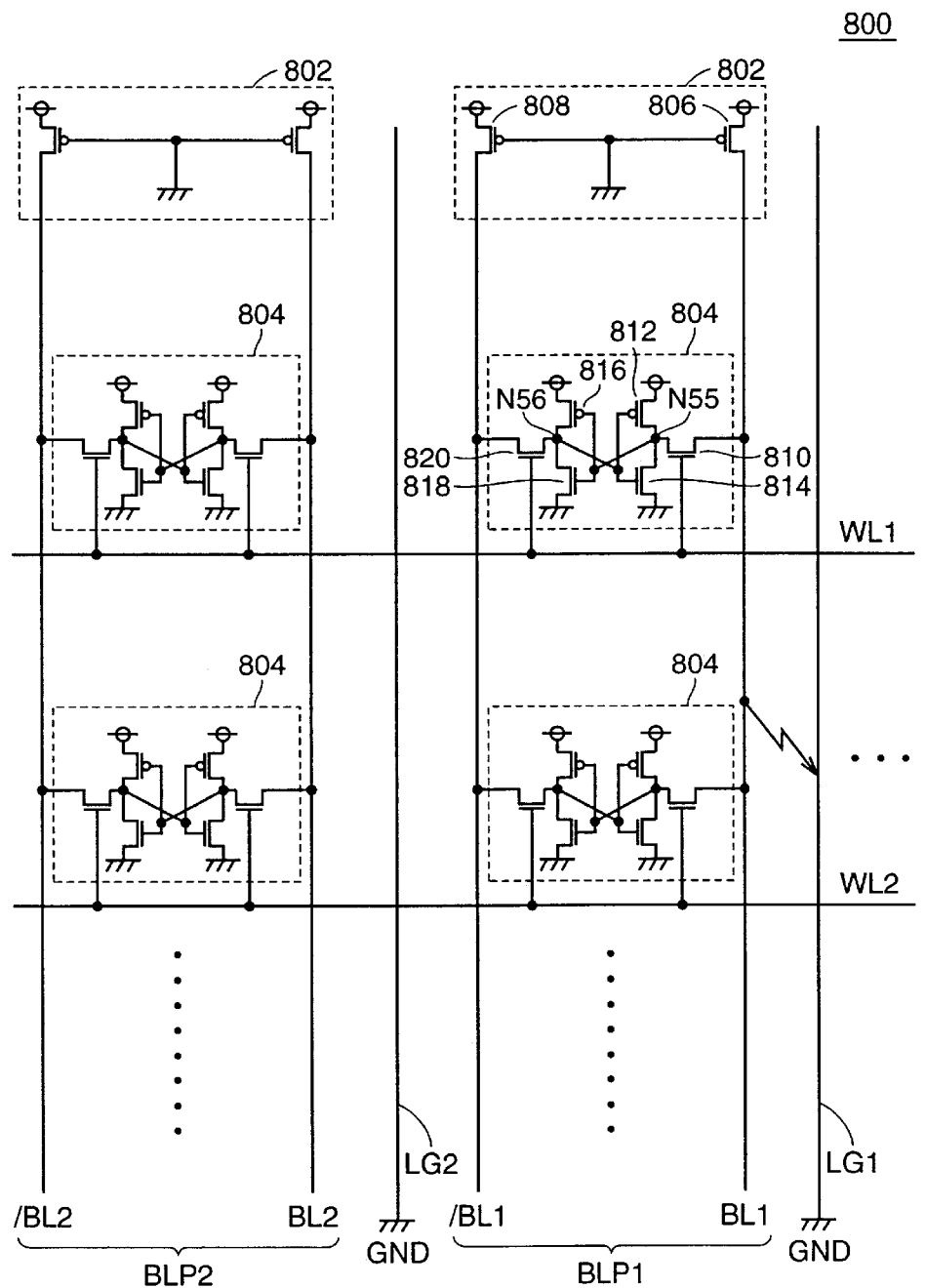
FIG. 16 is a circuit diagram showing the configuration of a memory cell array 800 of a conventional SRAM.
Figure 17:
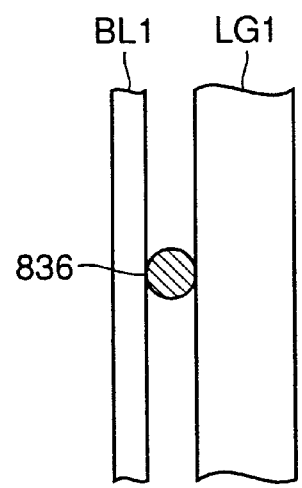
FIG. 17 is a diagram for explaining a failure which occurs in the memory array.
Figure 18:
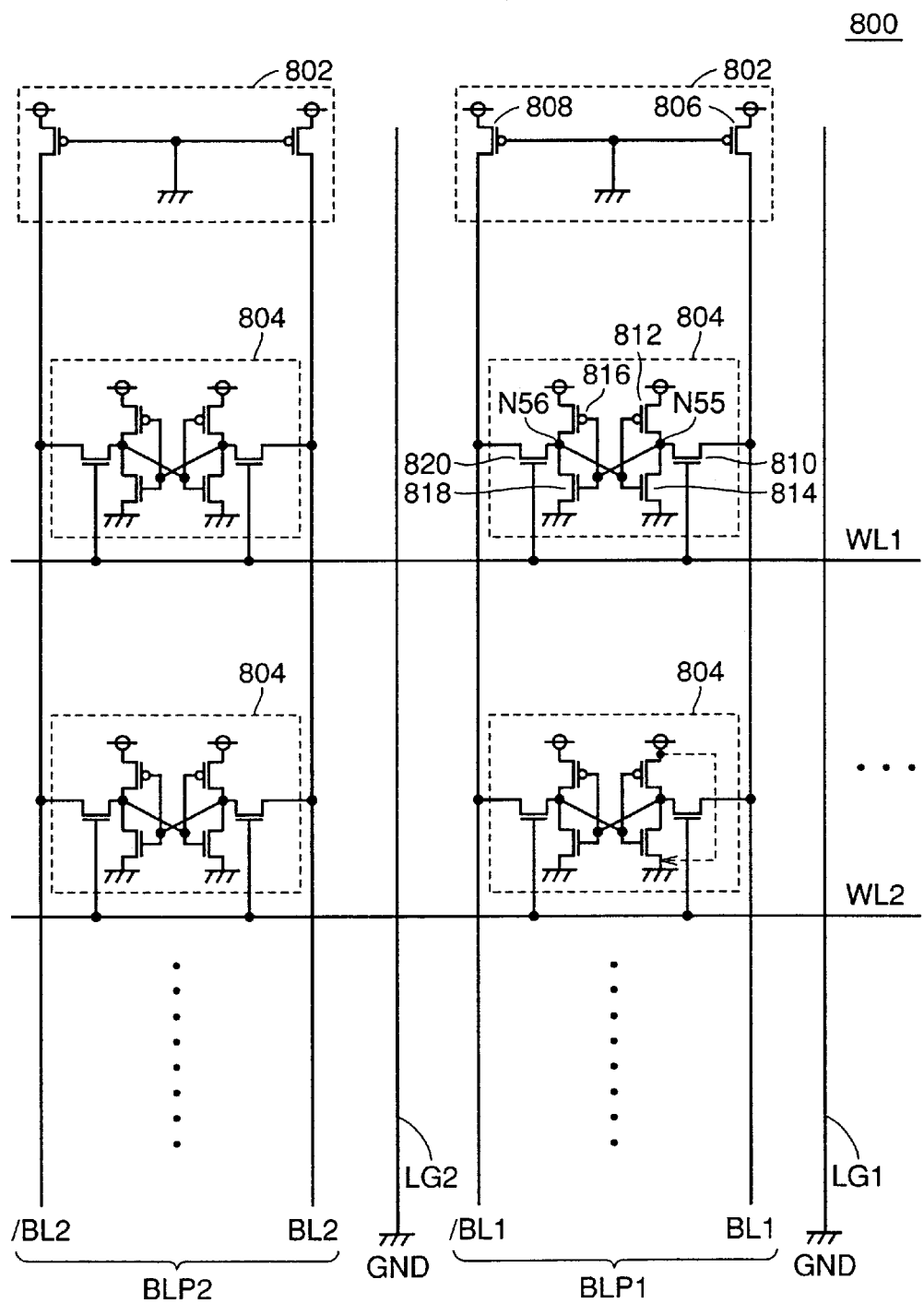
FIG. 18 is a circuit diagram showing a path of a current which flows due to a failure occurred in another position.
Figure 19:
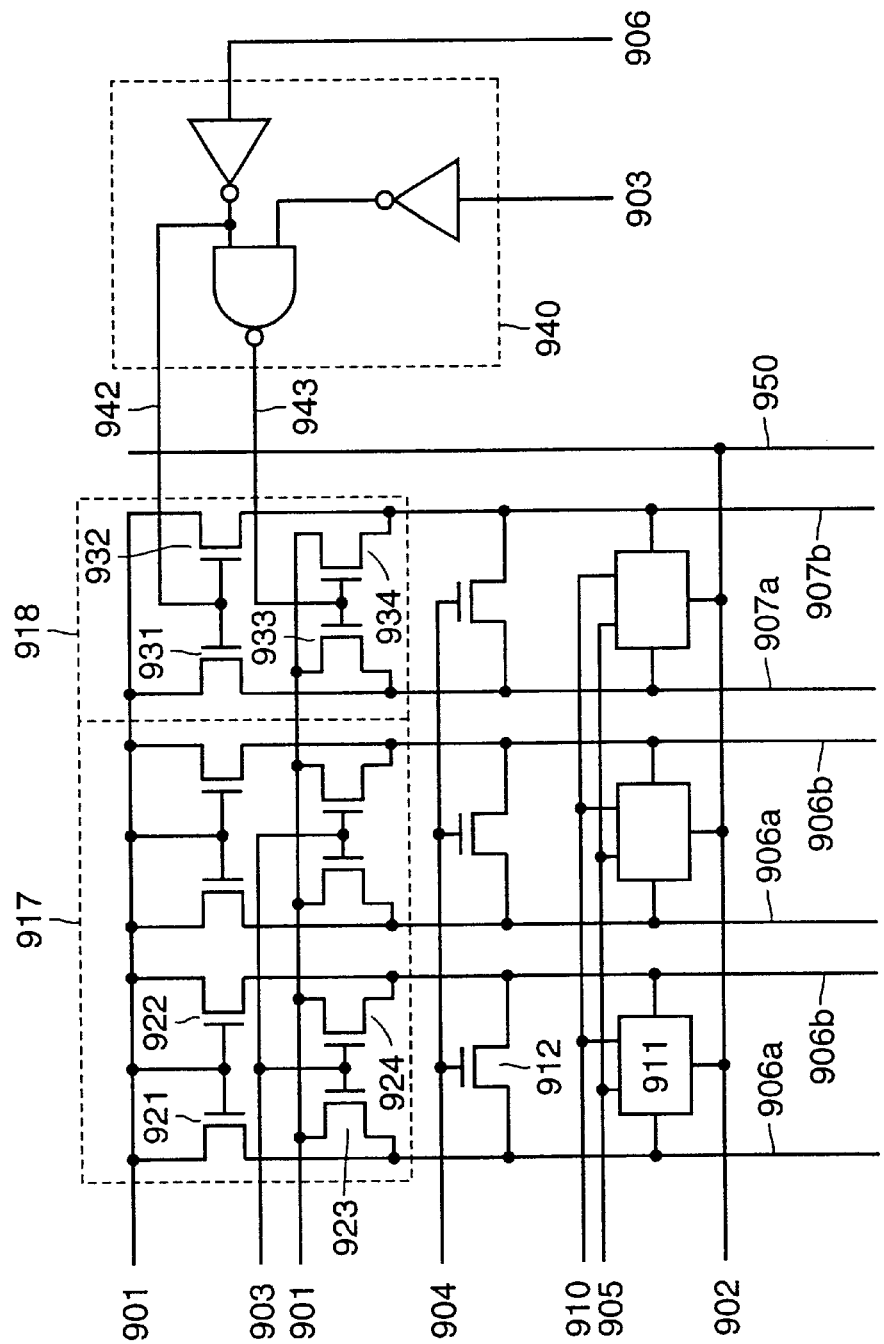
FIG. 19 is a circuit diagram showing the configuration of a memory cell array of a conventional SRAM disclosed in Japanese Patent Laying-Open No. 7-45093.

Load circuit 420 may have the configuration similar to that of load circuit 120 shown in FIG. 2 or that of load circuit 802 shown in FIG. 16.

Memory cell 426 includes: an N-channel MOS transistor 480 connected between bit line BL and a node N15 and having a gate connected to word line WL; a P-channel MOS transistor 486 connected between power supply line LVCC and a node N16 and having a gate connected to node N15; and an N-channel MOS transistor 488 connected between node N16 and the ground node and having a gate connected to node N15.

Memory cell 426 further includes an N-channel MOS transistor 490 connected between bit line /BL and node N16 and having a gate connected to word line WL; a P-channel MOS transistor 482 connected between power supply line LVCC and node N15 and having a gate connected to node N16; and an N-channel MOS transistor 484 connected between node N15 and the ground node and having a gate connected to node N16.

Potential supplying circuit 422 includes a latch circuit 428 for latching the potential of bit line BL; and a coupling circuit 430 for coupling bit line BL to the power supply potential in accordance with an output of latch circuit 428, chip select signal /CS, and signal CSdelay.

Latch circuit 428 includes: an N-channel MOS transistor 440 connected between power supply line LVCC and a node N11 and having a gate for receiving chip select signal /CS; a P-channel MOS transistor 446 connected between the power supply node and a node N12 and having a gate connected to node N11; and an N-channel MOS transistor 448 connected between node N12 and the ground node and having a gate connected to node N11.

Latch circuit 428 further includes: an N-channel MOS transistor 450 having a source and a drain connected to node N12 and a gate for receiving chip select signal /CS; a P-channel MOS transistor 442 connected between the power supply node and node N11 and having a gate connected to node N12; and an N-channel MOS transistor 444 having a gate connected to node N12, of which one end is connected to node N11 and of which other end is open.

Coupling circuit 430 includes: a P-channel MOS transistor 434 connected between the power supply node and bit line BL and having a gate for receiving chip select signal /CS; and P-channel MOS transistors 436 and 438 connected in series between the power supply node and bit line BL. The gate of P-channel MOS transistor 436 receives signal CSdelay. The gate of P-channel MOS transistor 438 is connected to node N12.

Figure 9:
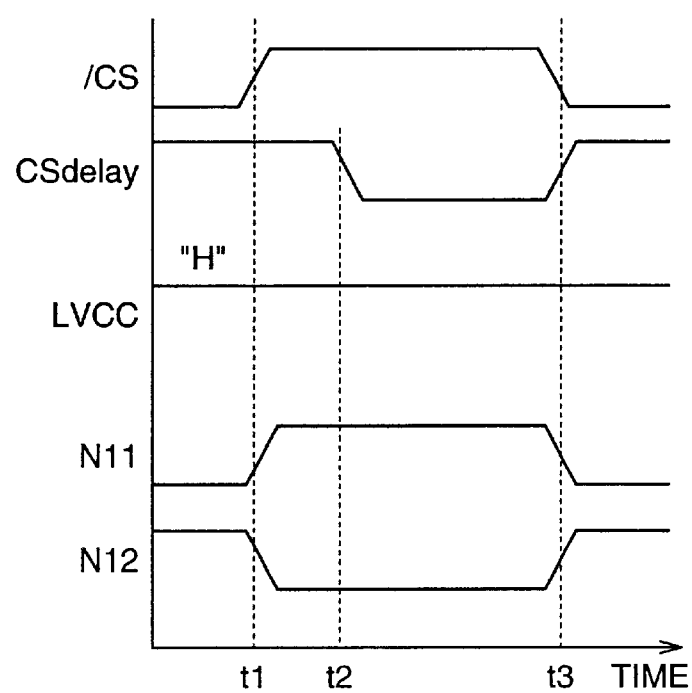
FIG. 9 is an operational waveform chart for explaining the operation of a potential supply circuit 422 in the case where no short circuit occurs in a memory cell.

FIG. 9 is an operational waveform chart for explaining the operation of potential supplying circuit 422 in the case where no short circuit occurs in a memory cell.

Referring to FIGS. 8 and 9, in an active state before time t1, P-channel MOS tranisstor434 is conductive, so that power supply line LVCC is at the H level.

At time t1, to set the standby mode, chip select signal /CS is changed from the L level to the H level. N-channel MOS transistor 440 is made conductive, the potential at node N11 is set to the H level from the L level, and the potential at node N12 changes from the H level to the L level. P-channel MOS transistor 438 is made conductive.

At time t2, when signal CSdelay changes from the H level to the L level, P-channel MOS transistor 436 becomes conductive, and the power supply potential is supplied to power supply line LVCC via P-channel MOS transistors 436 and 438. The potential on power supply line LVCC can therefore maintain the H level.

Figure 10:
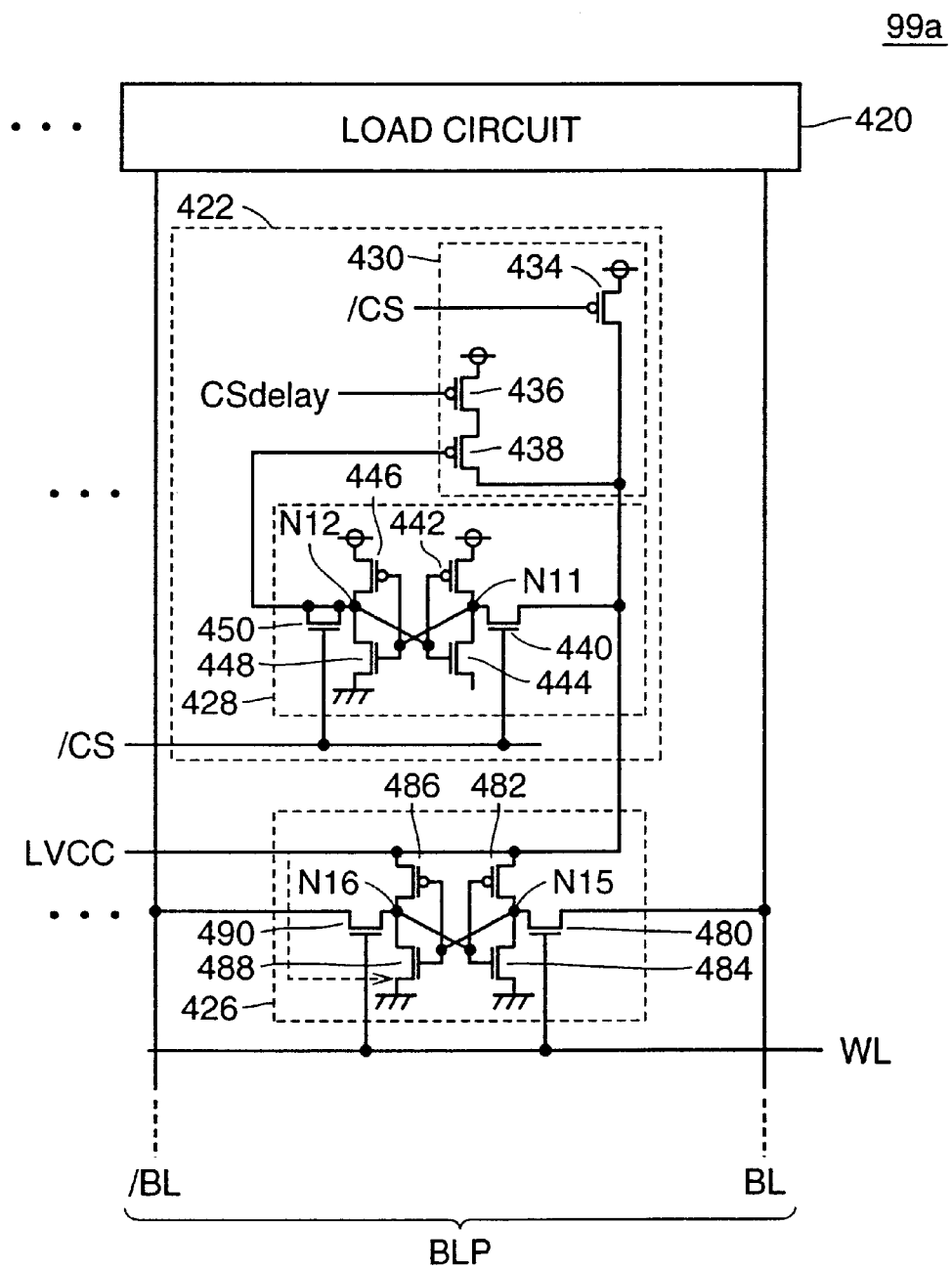
FIG. 10 is a diagram showing a case where a short circuit occurs between the power supply line and the ground node in a memory cell.

FIG. 10 is a diagram showing a case where a short circuit occurs between the power supply line and the ground node in the memory cell.

Referring to FIG. 10, a conductive path is formed by a foreign matter or the like between power supply line LVCC and the power supply node in the memory cell, which is a failure causing an increase in the standby current in the conventional technique.

Figure 11:
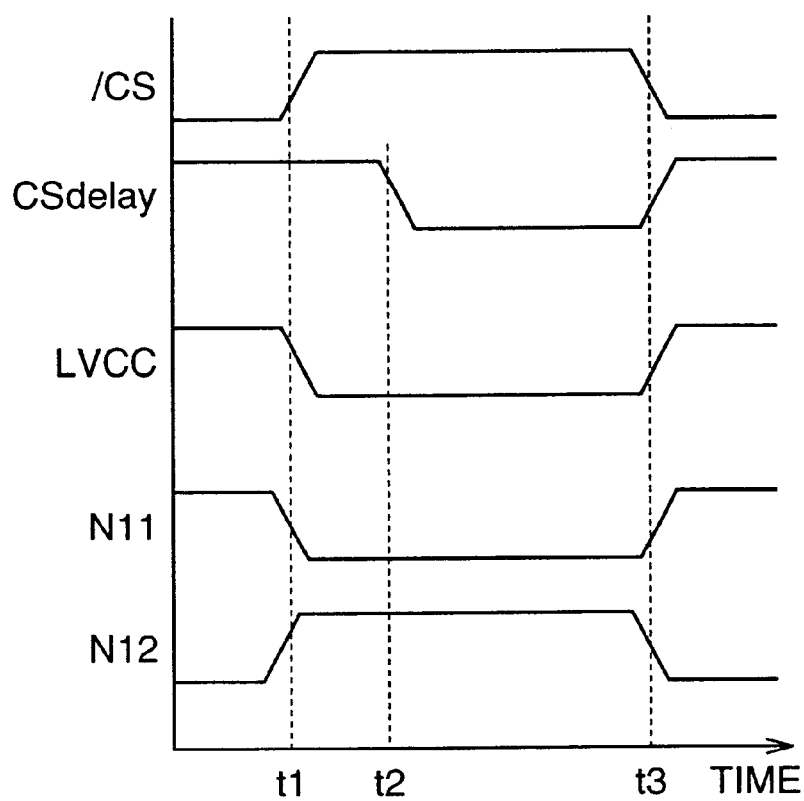
FIG. 11 is an operational waveform chart for explaining the operation of a potential supply circuit 422 in the case where a short circuit shown in FIG. 10 occurs.

FIG. 11 is an operational waveform chart for explaining the operation of potential supplying circuit 422 in the case where the short circuit shown in FIG. 10 occurs.

Referring to FIGS. 10 and 11, before time t1, P-channel MOS transistor 434 is conductive, so that power supply line LVCC is set at the H level.

At time t1, chip select signal /CS is set from the L level to the H level to set the standby mode. By the conductive path due to the short circuit, the potential on power supply line LVCC changes to the L level. In latch circuit 428, since the potential of power supply line LVCC is supplied to node N11, the potential at node N11 changes to the L level. Accordingly, the potential at node N12 changes from the L level to the H level, and P-channel MOS transistor 438 is set in a non-conductive state.

At time t2, signal CSdelay goes low from the H level, and P-channel MOS transistor 436 is made conductive. However, since P-channel MOS transistor 438 remains non-conductive, power supply line LVCC is not coupled to the power supply potential. In the standby mode from time t2 to time t3, therefore, the current does not flow from the power supply node into power supply line LVCC where the short circuit occurs, and the potential of power supply line LVCC is held at the L level. Thus, an unnecessary current in the standby mode can be reduced.

Latch circuit 428 shown in FIGS. 8 and 10 also has the circuit configuration similar to that of latch circuit 128 described by referring to FIG. 7 in the first embodiment. Therefore, latch circuit 428 can be obtained by modifying the memory cell. In the case of supplying the power supply potential via power supply line LVCC commonly to memory cells arranged in the row direction, latch circuits can be disposed in correspondence with power supply line LVCC at the same pitch as the row of memory cells. In this case, the latch circuit can be disposed in an area corresponding to one column of memory cells in the memory array. In the case of supplying the power supply potential via power supply line LVCC commonly to memory cells arranged in the column direction, latch circuits can be disposed in correspondence with power supply line LVCC at the same pitch as the column of memory cells. In this case, the latch circuit can be disposed in an area corresponding to one row of memory cells. Therefore, the standby current can be reduced while suppressing increase in the area in the memory cell array.

As described above, in the semiconductor memory device of the second embodiment as well, first, the current in the standby mode can be reduced in the case where a short circuit which is small enough not to cause an operation failure occurs.

Second, in a memory cell column in which a short circuit occurs in a bit line and which is replaced by a redundancy column, the power supply current in the standby mode can be reduced.

Third Embodiment

In a third embodiment, by using power-on reset signal 1 output from power-on resetting circuit 113 in FIG. 1 at turn-on, whether the power supply potential is supplied to the bit line or not is determined.

Figure 12:
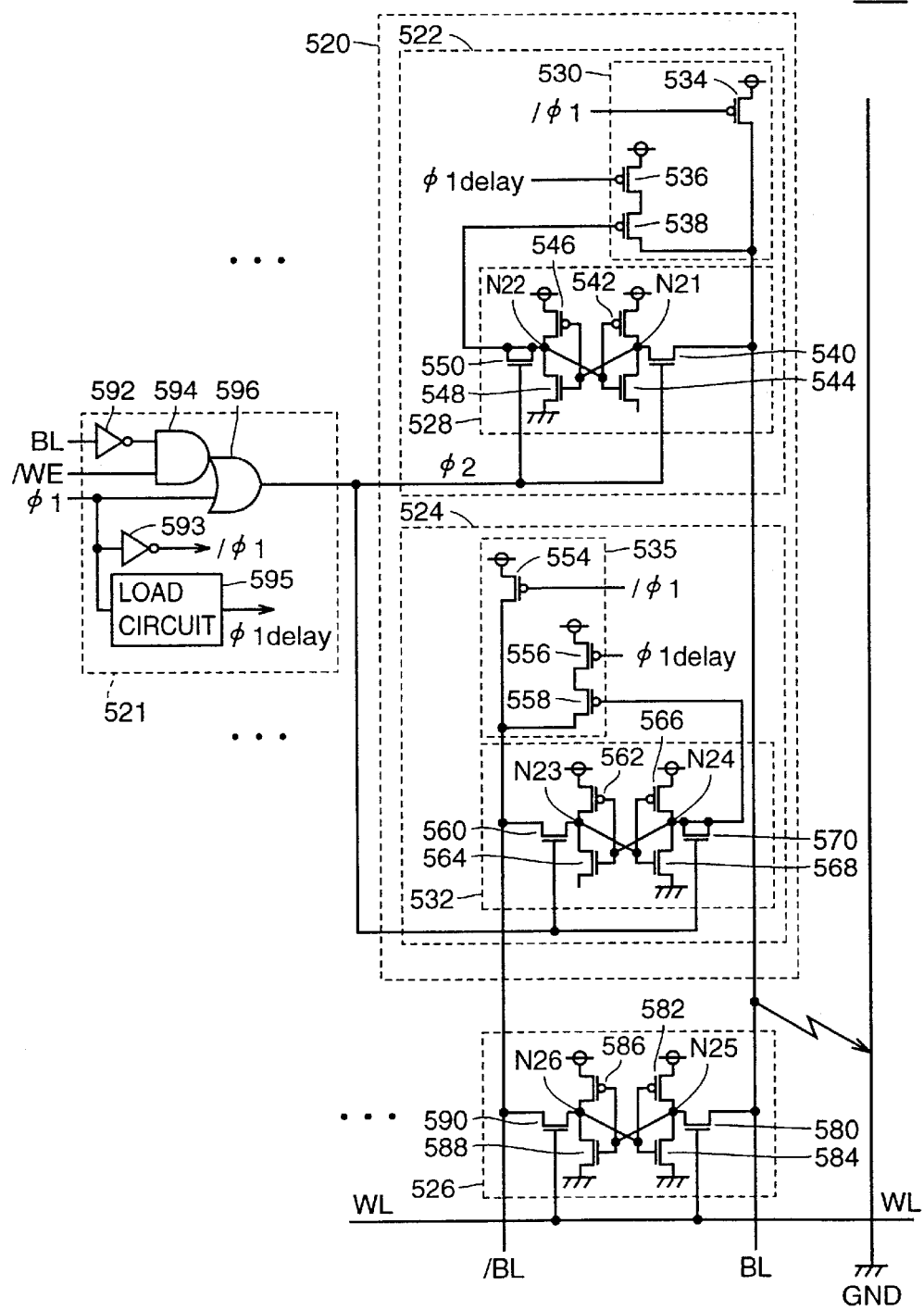
FIG. 12 is a circuit diagram showing the configuration of a memory cell array 99b of a semiconductor memory device of a third embodiment.

FIG. 12 is a circuit diagram showing the configuration of a memory cell array 99b of a semiconductor memory device according to the third embodiment.

Referring to FIG. 12, memory cell array 99b includes: a load circuit 520 connected to bit lines BL and /BL; and a memory cell 526 provided at the intersecting point of bit line pair BLP of bit lines BL and /BL and word line WL.

Memory cell array 99b further includes a control circuit 521 for outputting a control signal $\phi 2$ in accordance with the potential of bit line BL, signal /WE, and power-on reset signal $\phi 1$. Control circuit 521 includes: an inverter 592 whose input is connected to bit line BL; an AND circuit 594 for receiving an output of inverter 592 and write enable signal /WE; an OR circuit 596 for receiving an output of AND circuit 594 and power-on reset signal $\phi 1$ and outputting control signal $\phi 2$; an inverter 593 for receiving power-on reset signal $\phi 1$, inverting it, and outputting a signal /$\phi 1$; and a delay circuit 595 for delaying power-on reset signal $\phi 1$ and outputting a signal $\phi 1$delay.

Memory cell 526 includes: an N-channel MOS transistor 580 connected between bit line BL and a node N25 and having a gate connected to word line WL; a P-channel MOS transistor 586 connected between the power supply node and a node N26 and having a gate connected to node N25; and an N-channel MOS transistor 588 connected between node N26 and the ground node and having a gate connected to node N25.

Memory cell 526 further includes: an N-channel MOS transistor 590 connected between bit line /BL and node N26 and having a gate connected to word line WL; a P-channel MOS transistor 582 connected between the power supply node and node N25 and having a gate connected to node N26; and an N-channel MOS transistor 584 connected between node N25 and the ground node and having a gate connected to node N26.

Load circuit 520 includes a load circuit 522 connected to bit line BL and a load circuit 524 connected to bit line /BL.

Load circuit 522 includes: a latch circuit 528 for latching the potential of bit line BL; and a coupling circuit 530 for coupling bit line BL to the power supply potential in accordance with an output of latch circuit 528.

Latch circuit 528 includes: an N-channel MOS transistor 540 connected between bit line BL and a node N21 and receiving signal $\phi 2$ by its gate; a P-channel MOS transistor 546 connected between the power supply node and a node N22 and having a gate connected to node N21; and an N-channel MOS transistor 548 connected between node N22 and the ground node and having a gate connected to node N21.

Latch circuit 528 further includes: an N-channel MOS transistor 550 having a source and a drain connected to node N22 and having a gate for receiving signal $\phi 2$; a P-channel MOS transistor 542 connected between the power supply node and node N21 and whose gate is connected to node N22; and an N-channel MOS transistor 544 having a gate connected to node N22, whose one end is connected to node N21, and whose other end is open.

Coupling circuit 530 includes: a P-channel MOS transistor 534 connected between the power supply node and bit line BL and having a gate for receiving signal /$\phi 1$; and P-channel MOS transistors 536 and 538 connected in series between the power supply node and bit line BL. The gate of P-channel MOS transistor 536 receives signal $\phi 1$delay. The gate of P-channel MOS transistor 538 is connected to node N22.

Load circuit 524 includes: a latch circuit 532 for latching the potential of bit line /BL; and a coupling circuit 535 for coupling the power supply node and bit line /BL in accordance with an output of latch circuit 532.

Latch circuit 532 includes: an N-channel MOS transistor 560 connected between bit line /BL and a node N23 and having a gate for receiving signal φ2; a P-channel MOS transistor 566 connected between the power supply node and a node N24 and having a gate connected to node N23; and an N-channel MOS transistor 568 connected between node N24 and the ground node and having a gate connected to node N23.

Latch circuit 532 further includes: an N-channel MOS transistor 570 having a source and a drain connected to node N24 and having a gate for receiving signal φ2; a P-channel MOS transistor 562 connected between the power supply node and node N23 and having a gate connected to node N24; and an N-channel MOS transistor 564 having a gate connected to node N24, of which one end is connected to node N23, and of which other end is open.

Coupling circuit 535 includes: a P-channel MOS transistor 554 connected between the power supply node and bit line /BL and having a gate for receiving signal /φ1; and P-channel MOS transistors 556 and 558 connected in series between the power supply node and bit line BL. The gate of P-channel MOS transistor 556 receives signal φ1delay. The gate of P-channel MOS transistor 558 is connected to node N24.

The operations of control circuit 521 and load circuit 520 in FIG. 12 will be described hereinafter.

FIG. 13 is a diagram showing the logic state of write enable signal /WE.

Referring to FIG. 13, write enable signal /WE is set to the H level in the standby mode and reading mode. Write enable signal /WE is set to the L level in the writing mode.

FIG. 14 is a diagram showing states of nodes when the initial potential is applied to the bit line after turn-on and the bit line enters a floating state, that is, when signal φ1delay is at the H level.

Referring to FIG. 14, the case where no short circuit occurs will be described first.

In the standby mode, write enable signal /WE is at the H level, bit line is at the H level, and signal φ1delay is at the H level. Accordingly, control signal φ2 is set to the H level. Latch circuit 528 latches the H level of the bit line at node N21 and latches the L level at node N22. Coupling circuit 530 therefore becomes conductive.

The reading mode will be described. In the reading mode, write enable signal /WE is at the H level, bit line is at the H level, and signal φ1delay is at the H level. Accordingly, control signal φ2 set to the H level. Latch circuit 528 latches the H level of bit line at node N21, and latches the L level at node N22. Consequently, coupling circuit 530 becomes conductive.

The writing mode will now be described. In the writing mode, write enable signal /WE is at the L level, bit line is at the H level, and signal φ1delay is at the H level. Accordingly, control signal φ2 set to the H level. Latch circuit 528 latches the H level at node N21, and latches the L level at node N22. Consequently, coupling circuit 530 becomes conductive.

When no short circuit occurs between the bit line and the ground line, the bit line initialized to the H level by power-on reset signal φ1 at turn-on and then entered in the floating state is at the H level. Latch circuit 528 latches the potential and, according to the output of the latch circuit, coupling circuit 530 couples the bit line to the power supply potential.

Referring again to FIG. 14, the operation in the case where a short circuit occurs between the bit line and the ground line will now be described.

In the standby mode, write enable signal /WE is at the H level, and the bit line is at the L level due to a short circuit. Signal φ1delay is at the H level and control signal φ2 is accordingly set to the H level. Latch circuit 528 consequently latches the L level at node N21 and latches the H level at node N22. Coupling circuit 530 is made non-conductive.

In the reading mode, write enable signal /WE is at the H level, and the bit line is at the L level due to a short circuit. Signal φ1delay is at the H level and control signal φ2 is accordingly set to the H level. Latch circuit 528 consequently latches the L level at node N21 and latches the H level at node N22. Coupling circuit 530 is made non-conductive.

In the writing mode, write enable signal /WE is at the L level, and the bit line is at the L level due to a short circuit. Signal φ1delay is at the H level and control signal φ2 is accordingly set to the H level. Latch circuit 528 consequently latches the L level at node N21 and latches the H level at node N22. Coupling circuit 530 is made non-conductive.

In the case where a short circuit occurs between the bit line and the ground line, the bit line initialized to the H level by power-on reset signal φ1 at turn-on and then entered in the floating state is at the L level. Latch circuit 528 latches the potential and, according to the output of the latch circuit, coupling circuit 530 does not couple the bit line to the power supply potential. Consequently, only in the case where a short circuit occurs in the bit line to the ground potential, P-channel MOS transistor 538 becomes non-conductive, and an unnecessary standby current does not flow.

FIG. 15 is a diagram showing an operation state of load circuit 520 when signal φ1delay goes low after elapse of some time since the turn-on.

Referring to FIGS. 12 and 15, a state where no short circuit occurs will be described first.

In the standby mode, write enable signal /WE is at the H level, bit line is at the H level, and signal φ1delay is at the L level, and accordingly, control signal φ2 is set to the L level. It makes N-channel MOS transistor 540 non-conductive. As shown in FIG. 14, since coupling circuit 530 has been conductive and the bit line has been at the H level, latch circuit 528 maintains a state that the H level is latched at node N21 and the L level is latched at node N22. Coupling circuit 530 maintains the conductive state.

In the reading mode, write enable signal /WE is at the H level, bit line is at the H level, and signal φ1delay is at the L level, and accordingly, control signal φ2 is set to the L level. It makes N-channel MOS transistor 540 non-conductive. As shown in FIG. 14, since coupling circuit 530 has been conductive and the bit line has been at the H level, latch circuit 528 maintains a state that the H level is latched at node N21 and the L level is latched at node N22. Coupling circuit 530 maintains the conductive state.

The writing mode will now be described. In the writing mode, data is written into a memory cell, so that the bit line is driven to the H or L level.

First, the case where the bit line is at the H level in the writing mode will be described. Write enable signal /WE is at the L level, bit line is at the H level, and signal φ1delay is at the L level, and accordingly, control signal φ2 is set to the L level. Latch circuit 528 latches the H level at node N21 and latches the L level at node N22. Consequently, coupling circuit 530 is made conductive.

The case where the bit line is at the L level in the writing mode will now be described. Write enable signal /WE is at the H level, signal φ1delay is at the L level, and accordingly, control signal φ2 is set to the L level. In this state, bit line is driven to the L level. Since N-channel MOS transistor 540 is in the non-conductive state, even if the bit line is driven to the L level, latch circuit 528 latches the L level at node N21 and latches the H level at node N22. Consequently, coupling circuit 530 is made conductive.

Therefore, in the case where the bit line is not short-circuited to the ground potential, coupling circuit 530 is always in the conductive state, so that no problem occurs in the normal operations of the memory cells.

Referring again to FIG. 15, the operations in the case where a short circuit occurs between the bit line and the ground line will now be described.

In the standby mode, write enable signal /WE is at the H level, and the bit line is at the L level due to the short circuit. Although power-on reset signal φ1 has been already at the L level and signal φ1delay is also at the L level. According to an output of AND circuit 594, control signal φ2 is set to the H level. Latch circuit 528 latches the L level at node N21, and latches the H level at node N22. Consequently, according to the potential of the bit line, coupling circuit 530 becomes non-conductive.

In the reading mode, write enable signal /WE is at the H level and the bit line is at the L level due to a short circuit. Although power-on reset signal φ1 has been already at the L level and signal ldelay is also at the L level, control signal φ2 is set to the H level in accordance with an output of AND circuit 594. Latch circuit 528 latches the L level at node N21 and latches the H level at node N22. Consequently, according to the potential of the bit line, coupling circuit 530 becomes non-conductive.

In the writing mode, write enable signal /WE is at the L level and the bit line is at the L level due to a short circuit. Both power-on reset signal φ1 and signal φ1delay are at the L level, and control signal φ2 is set to the L level. Consequently, latch circuit 528 latches the L level captured in the case of "writing mode with a short circuit" in FIG. 14 at node N21, and latches the H level at node N22. Coupling circuit 530 consequently maintains the non-conductive state.

As described above, in the standby mode and reading mode, according to the potential of the bit line, the conductive/non-conductive state of coupling circuit 530 is determined. In the case where the bit line is short-circuited to the ground potential, coupling circuit 530 remains in the non-conductive state in the standby and reading modes. Thus, an unnecessary standby current does not flow.

Obviously, it is also possible to latch the bit line potential at power-on in the latch circuit and control the conductive/non-conductive state of the coupling circuit after that on the basis of the data latched at that time. However, it can be considered that the data latched in the latch circuit is inverted due to noise or the like. Consequently, the potential of the bit line in the standby mode and the reading mode after elapse of some time since the power-on is also used for controlling coupling circuit 530.

On the other hand, in the writing mode, there is a case such that the bit line is driven to the L level at the time of writing data into a memory cell, so that the potential of the bit line at this time is not latched by the latch circuit.

Each of latch circuits 528 and 532 shown in FIG. 12 has also the configuration similar to that of latch circuit 128 described by referring to FIG. 7 in the first embodiment. Therefore, since the latch circuit can be obtained by modifying the memory cell, latch circuits can be disposed at the same pitch as that of memory cells. Thus, the standby current can be reduced while suppressing an increase in the area in the memory cell array.

As described above, according to the semiconductor device of the third embodiment, first, the current in the standby mode can be reduced in the case where a short circuit which is small enough not to cause an operation failure occurs.

Second, in a memory cell column in which a short circuit occurs in a bit line and which is replaced by a redundancy column, the power supply current in the standby mode can be reduced.

Third, since the power supply is interrupted to the bit line in which a short circuit occurs at turn-on, the current of memory cells which are not used not only in the standby mode but also in the reading mode can be reduced.

Although the case where the memory cell in an SRAM is of a CMOS type of 6 transistors has been described as an example, the invention can be also applied to a memory cell of 4 transistors of a high-resistance load type.

Although the case where the invention is applied to the SRAM has been described, the invention can be also applied to other memories in which a bit line is connected to the bias potential and data in a memory cell is read by a sense amplifier. For example, the invention can be also preferably applied to a dynamic random access memory in which a bit line is precharged to an equalize potential in such a manner that the bit line is temporally set to a floating state and, in accordance with the potential of the bit line at that time, whether the bit line is coupled to the equalize potential or not is determined.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a standby mode as operation modes, comprising a memory cell array including a plurality of memory cells arranged in a matrix,
   said memory cell array including:
      a plurality of bit lines provided in correspondence with columns of said memory cells; and
      a load circuit for coupling said plurality of bit lines to a predetermined bias potential, after that, making said plurality of bit lines enter a floating state separated from said predetermined bias potential, and in accordance with a potential of each of said plurality of bit lines in said floating state, coupling said bias potential to each of said plurality of bit lines in said standby mode.

2. The semiconductor memory device according to claim 1, wherein in said normal mode, said load circuit couples said plurality of bit lines to the predetermined bias potential to prepare for a data reading operation, and at the time of switch from said normal mode to said standby mode, said load circuit once disconnects said plurality of bit lines from said bias potential so that said plurality of bit lines enter said floating state, and couples said plurality of bit lines to said bias potential in accordance with the potentials of corresponding said plurality of bit lines in said floating state.

3. The semiconductor memory device according to claim 2, wherein said load circuit includes
   a plurality of holding circuits for capturing and holding potential information according to the potentials of corresponding said plurality of bit lines in said floating state at the time of switch from said normal mode to said standby mode; and a plurality of coupling units coupling corresponding said plurality of bit lines to said bias potential in said normal mode, disconnecting corresponding said plurality of bit lines from said bias potential temporally and making said plurality of bit lines enter said floating state, and coupling corresponding said plurality of bit lines to said bias potential in accordance with outputs of corresponding said plurality of holding circuits at the time of switch from said normal mode to said standby mode.

4. The semiconductor memory device according to claim 3, wherein each of said plurality of coupling units includes a first coupling circuit for coupling a corresponding bit line to said bias potential in accordance with a mode switch signal; and a second coupling circuit for coupling said corresponding bit line to said bias potential in accordance with an output of a corresponding one of said plurality of holding circuits.

5. The semiconductor memory device according to claim 2, wherein said holding circuits are arranged at the same arrangement pitch as that of columns of said memory cells in said memory cell array.

6. The semiconductor memory device according to claim 5, wherein each of said plurality of memory cells connected to a first bit line out of said plurality of bit lines includes a first access transistor connected between said first bit line and a first storage node and having a gate connected to a corresponding word line, a second access transistor connected between a first complementary bit line which is paired with said first bit line and a second storage node and having a gate connected to said corresponding word line, a first load element for coupling said first storage node to a power supply potential, a second load element for coupling said second storage node to the power supply potential, a first driver transistor connected between said first storage node and a ground node and having a gate connected to said second storage node, and a second driver transistor connected between said second storage node and the ground node and having a gate connected to said first storage node;

a first holding circuit provided in correspondence with said first bit line in said plurality of holding circuits includes a first transistor connected between the corresponding bit line and a third storage node and having a gate for receiving a mode switch signal;

a third load element for coupling an output node to the power supply potential, and a third driver transistor connected between said output node and the ground node and having a gate connected to said third storage node; and relative positions of said third load element and said third driver transistor with respect to said first transistor respectively correspond to relative positions of said second load element and said second driver transistor with respect to said first access transistor.

7. The semiconductor memory device according to claim 1, further comprising a power-on resetting circuit for outputting a power-on reset signal at turn-on, wherein said load circuit couples said plurality of bit lines to said predetermined bias potential in accordance with said power-on reset signal and, when resetting of said power-on reset signal is canceled, said load circuit temporally disconnects said plurality of bit lines from said bias potential to make said plurality of bit lines enter said floating state, and couples each of said plurality of bit lines to said bias potential in accordance with the potentials of corresponding said plurality of bit lines in said floating state.

8. The semiconductor memory device according to claim 7, wherein said load circuit includes a plurality of holding circuits for capturing and holding potential information according to the potential of corresponding said plurality of bit lines in said floating state when resetting of said power-on reset signal is canceled; and a plurality of coupling units, at the time of resetting by said power-on reset signal, for coupling corresponding said plurality of bit lines to said bias potential and, when resetting by said power-on reset signal is canceled, disconnecting corresponding said plurality of bit lines from said bias potential temporally and making corresponding said plurality of bit lines enter said floating state, and coupling corresponding said plurality of bit lines to said bias potential in accordance with outputs of corresponding said plurality of holding circuits.

9. The semiconductor memory device according to claim 8, wherein each of said plurality of coupling units includes a first coupling circuit for coupling a corresponding bit line to said bias potential in accordance with said power-on reset signal; and a second coupling circuit for coupling said corresponding bit line to said bias potential in accordance with an output of a corresponding one of said holding circuits.

10. The semiconductor memory device according to claim 7, wherein said holding circuits are arranged at the same arrangement pitch as that of columns of said memory cells in said memory cell array.

11. The semiconductor memory device according to claim 10, wherein each of said plurality of memory cells connected to a first bit line out of said plurality of bit lines includes a first access transistor connected between said first bit line and a first storage node and having a gate connected to a corresponding word line, a second access transistor connected between a first complementary bit line which is paired with said first bit line and a second storage node and having a gate connected to said corresponding word line, a first load element for coupling said first storage node to a power supply potential, a second load element for coupling said second storage node to the power supply potential, a first driver transistor connected between said first storage node and a ground node and having a gate connected to said second storage node, and a second driver transistor connected between said second storage node and the ground node and having a gate connected to said first storage node;

a first holding circuit provided in correspondence with said first bit line in said plurality of holding circuits includes a first transistor connected between a corresponding bit line and a third storage node, which is made conductive in accordance with said power-on reset signal, a third load element for coupling an output node to the power supply potential, and a third driver transistor connected between said output node and the ground node and having a gate connected to said third storage node; and relative positions of said third load element and said third driver transistor with respect to said first transistor respectively correspond to relative positions of said second load element and said second driver transistor with respect to said first access transistor.

12. A semiconductor memory device having a normal mode and a standby mode as operation modes, comprising a memory cell array including a plurality of memory cells arranged in a matrix, said memory cell array including a power supply line for supplying a power supply potential to a part of said plurality of memory cells; and a potential supplying circuit for coupling said power supply line to said power supply potential, after that, making said power supply line enter a floating state separated from said power supply potential and, in accordance with a potential of said power supply line in said floating state, coupling said power supply line to said power supply potential in said standby mode.

13. The semiconductor memory device according to claim 12, wherein in said normal mode, said potential supplying circuit couples said power supply line to said power supply potential, and at the time of switch from said normal mode to said standby mode, said potential supplying circuit once disconnects said power supply line from said power supply potential to make said power supply line enter said floating state, and couples said power supply line to said power supply potential in accordance with the potential of said power supply line in said floating state.

14. The semiconductor memory device according to claim 13, wherein said potential supplying circuit includes a holding circuit for capturing and holding potential information according to the potential of said power supply line in said floating state at the time of switch from said normal mode to said standby mode; and a coupling unit, in said normal mode, for coupling said power supply line to said power supply potential and, at the time of switch from said normal mode to said standby mode, once disconnecting said power supply line from said power supply potential to make said power supply line enter said floating state, and coupling said power supply line to said power supply potential in accordance with an output of said holding circuit.

15. The semiconductor memory device according to claim 14, wherein said coupling unit includes a first coupling circuit for coupling said power supply line to said power supply potential in accordance with a mode switch signal; and a second coupling circuit for coupling said power supply line to said power supply potential in accordance with an output of said holding circuit.

16. The semiconductor memory device according to claim 13, wherein said holding circuits are arranged at the same arrangement pitch as that of columns of said memory cells in said memory cell array.

17. The semiconductor memory device according to claim 16, wherein said memory cell connected to said power supply line includes a first access transistor connected between a first bit line and a first storage node and having a gate connected to a corresponding word line, a second access transistor connected between a first complementary bit line which is paired with said first bit line and a second storage node and having a gate connected to said corresponding word line, a first load element for coupling said first storage node to said power supply potential, a second load element for coupling said second storage node to said power supply potential, a first driver transistor connected between said first storage node and a ground node and having a gate connected to said second storage node, and a second driver transistor connected between said second storage node and the ground node and having a gate connected to said first storage node;

said holding circuit includes a first transistor connected between said power supply line and a third storage node and having a gate for receiving a mode switch signal, a third load element for coupling an output node to the power supply potential, and a third driver transistor connected between said output node and the ground node and having a gate connected to said third storage node; and relative positions of said third load element and said third driver transistor with respect to said first transistor respectively correspond to relative positions of said second load element and said second driver transistor with respect to said first access transistor.

* * * * *